United States Patent
Zhang et al.

(10) Patent No.: US 12,132,498 B2
(45) Date of Patent: Oct. 29, 2024

(54) MIN-SUM DECODER FOR ROW-IRREGULAR LOW DENSITY PARITY CHECK CODES

(71) Applicant: SK hynix Inc., Gyeonggi-do (KR)

(72) Inventors: Fan Zhang, San Jose, CA (US);
Meysam Asadi, San Jose, CA (US);
Haobo Wang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/182,838

(22) Filed: Mar. 13, 2023

(65) Prior Publication Data
US 2024/0313803 A1    Sep. 19, 2024

(51) Int. Cl.
*H03M 13/11* (2006.01)
*G06F 11/00* (2006.01)
*G06F 11/10* (2006.01)
*H03M 13/00* (2006.01)

(52) U.S. Cl.
CPC ..... *H03M 13/1105* (2013.01); *G06F 11/1076* (2013.01)

(58) Field of Classification Search
CPC ........... H03M 13/1171; H03M 13/114; H03M 13/116; H03M 13/1111; H03M 13/616; H03M 13/1102; H03M 13/112; H03M 13/255; H03M 13/1105; G11B 2020/185; G06F 11/1076
See application file for complete search history.

(56) References Cited

U.S. PATENT DOCUMENTS

| | | | |
|---|---|---|---|
| 7,337,384 B2 | 2/2008 | Lakaniemi | |
| 9,130,589 B2 * | 9/2015 | Li | H03M 13/1171 |
| 10,367,526 B2 * | 7/2019 | Liu | H03M 13/1171 |
| 10,700,706 B2 | 6/2020 | Zhang et al. | |
| 11,159,175 B2 * | 10/2021 | Vanaparthy | H03M 13/6502 |
| 11,184,024 B2 | 11/2021 | Xiong et al. | |
| 11,881,871 B1 * | 1/2024 | Zhang | H03M 13/611 |
| 2017/0149445 A1 * | 5/2017 | Liu | H03M 13/1171 |
| 2019/0326931 A1 * | 10/2019 | Liu | H03M 13/1148 |
| 2019/0334559 A1 | 10/2019 | Panteleev et al. | |
| 2022/0263524 A1 | 8/2022 | Kim | |

* cited by examiner

*Primary Examiner* — Justin R Knapp
(74) *Attorney, Agent, or Firm* — IP & T GROUP LLP

(57) ABSTRACT

Decoding method and memory system that classify check nodes in a matrix having irregular check node weights into different groups according to the check node weights, apply different scaling factors to respective constant node to variable node (C2V) messages in the different groups of the check nodes, and optionally add a compensation term to at least one of the C2V messages of the MS decoder.

18 Claims, 12 Drawing Sheets

FIG. 6C $$H = \begin{bmatrix} v_1 & v_2 & v_3 & v_4 & v_5 & v_6 & v_7 & v_8 \\ 1 & 1 & 1 & 0 & 0 & 0 & 0 & 0 \\ 1 & 1 & 1 & 1 & 1 & 0 & 0 & 0 \\ 0 & 0 & 0 & 1 & 1 & 1 & 1 & 0 \\ 0 & 0 & 1 & 1 & 1 & 1 & 1 & 1 \end{bmatrix} \begin{matrix} c_1 \\ c_2 \\ c_3 \\ c_4 \end{matrix}$$

FIG. 7A

```
if  cind == cnu (yy (i) , 3) %match ml_ind
    c2v_msg (i) = cnu (yy (i) , 2) ;
else
    c2v_msg (i) = cnu (yy (i) , 1) ;
end
```

FIG. 7B

```
function v2c = vnu_update (c2v, total_msg, beta, msg_bitwidth)
v2c = c2v;
for i=1:length (c2v)
    v2c (i) = beta*(total_msg-c2v (i)) ;
end
v2c = max(min(round (v2c) ,s^(msg_bitwidth-1)-1),-2^(msg_bitwidth-1)-1) ;
```

FIG. 7C

```
           function cnu = cnu_update (cnul,v2c,cind)
           cnul = abs (cnul) ;
           v2c = abs (v2c) ;
           cnu = cnul ;
           for  i=1:length (v2c)
Case A        %match m1
              if  cind == cnu (i,3)
                 if abs (v2c (i) ) <= abs (cnu (i, 2) )
                     cnu (i,1) = v2c (i) ;
                 else
                    cnu (i,1) = cnu (i,2) ;
                    cnu (i,3) = cnu (i,4) ;
                    cnu (i,2) = v2c (1) ;
                    cnu (i,4) = cind;
                 end
                 continue;
              end
Case B        %match m2
              if  cind == cnu (i,4)
                 if abs (v2c (i) ) <= abs (cnu (i, 1) )
                     cnu (i,2) = cnu (i,1) ;
                     cnu (i,4) = cnu (i,3) ;
                     cnu (i,1) = v2c (1) ;
                     cnu (i,3) = cind;
                 else
                     cnu (i,2) = v2c (i);
                 end
                 continue;
              end
Case C        #dont match m1 or m2
              if abs (v2c (i) ) <= abs (cnu (i,1) )
                 cnu (i,2) = cnu (i,1) ;
                 cnu (i,4) = cnu (i,3) ;
                 cnu (i,1) = v2c (1) ;
                 cnu (i,3) = cind;
              else
                if abs (v2c (i) ) <= abs (cnu (i,2) )
                    cnu (i,2) = v2c (i) ;
                    cnu (i,2) = v2c (i) ;
                end
              end
           end
```

MIN-SUM DECODER FOR ROW-IRREGULAR LOW DENSITY PARITY CHECK CODES

BACKGROUND

1. Field

The present invention relates to the scaling of low density parity check (LDPC) codes.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices. Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller can include an embedded processor that can execute functional components such as firmware. The SSD functional components are device specific, and in most cases, can be updated. The two main types of flash memory components are named after the NAND and NOR logic gates. The individual flash memory cells exhibit internal characteristics similar to those of their corresponding gates. The NAND-type flash memory may be written and read in blocks (or pages) which are generally much smaller than the entire memory space. The NOR-type flash allows a single machine word (byte) to be written to an erased location or read independently. The NAND-type operates primarily in memory cards, USB flash drives, solid-state drives, and similar products, for general storage and transfer of data.

As described in U.S. Pat. No. 10,700,706 (the entire contents of which are incorporated herein by reference), NAND flash-based storage devices have been widely adopted because of their faster read/write performance, lower power consumption, and shock proof features. In general, however, they are more expensive compared to hard disk drives (HDD). To bring costs down, NAND flash manufacturers have been pushing the limits of their fabrication processes towards 20 nm and lower, which often leads to a shorter usable lifespan and a decrease in data reliability. As such, a more powerful error correction code (ECC) is required over traditional Bose-Chaudhuri-Hocquenghem (BCH) codes to overcome the associated noises and interferences, and thus improve the data integrity. One such ECC is an LDPC code.

There are different iterative decoding algorithms for LDPC codes and associated decoders, such as bit-flipping (BF) decoding algorithms, belief-propagation (BP) decoding algorithms, sum-product (SP) decoding algorithms, min-sum (MS) decoding algorithms, Min-Max decoding algorithms, etc. Multiple decoding algorithms may be used in a particular system to permit different codewords to be decoded using different decoders depending on conditions such as noise level and interference. As described in U.S. Pat. No. 7,337,384 (the entire contents of which are incorporated herein by reference), prior methods and devices have used checksum-based error processing to provide unequal error detection (UED) for error tolerant applications.

As described in U.S. Pat. No. 11,184,024 (the entire contents of which are incorporated herein by reference), an LDPC code can be characterized by an M×N parity-check matrix H, the column weight of the i-th ($0 \leq i < N$) column of H is the number of non-zero entries in the i-th column of the parity-check matrix H. If column weights of all columns of H are the same, the LDPC code represented by H is called a regular LDPC code. Otherwise, the LDPC code is called an irregular LDPC code. In other words, columns of the parity-check matrix H of an irregular LDPC code have different column weights.

Irregular LDPC codes are characterized by a very sparse parity-check matrix H in which the column weight may vary from column to column and the row weight may vary from row to row. The ability to allocate the column and row weights flexibly provides a useful design freedom. Properly designed irregular LDPC codes tend to outperform regular LDPC codes for large block lengths; gains of up to 0.5 dB can be obtained.

Due to their flexibility and improved decoding performance, irregular LDPC codes are increasingly being used in a non-volatile memory system (e.g., a NAND flash memory) to ensure robust data storage and access.

In this context, embodiments of the present invention arise.

SUMMARY

In accordance with one embodiment of the invention, there is provided a decoding method that classifies check nodes in a matrix having irregular check node weights into different groups according to the check node weights, applies different scaling factors to respective constant node to variable node (C2V) messages in the different groups of the check nodes, and adds a compensation term to at least one of the C2V messages of the MS decoder.

In accordance with another embodiment of the invention, there is provided a memory system including a storage and a decoder coupled to the storage and configured to: classify check nodes in a matrix having irregular check node weights into different groups according to the check node weights, apply different scaling factors to respective constant node to variable node (C2V) messages in the different groups of the check nodes, and add a compensation term to at least one of the C2V messages of the MS decoder.

BRIEF DESCRIPTION OF THE DRAWINGS

FIGS. 6B and 6C are diagrams of a low-density parity check decoder nodes and a low density parity check H-matrix in accordance with embodiments of the present invention.

FIG. 7A is a depiction of exemplary program code for generating a check to variable node message in accordance with embodiments of the present invention.

FIG. 7B is a depiction of exemplary program code for generating a variable to check node message in accordance with embodiments of the present invention.

FIG. 7C is a depiction of exemplary program code for a control node unit in accordance with embodiments of the present invention.

DETAILED DESCRIPTION

Figure 1:
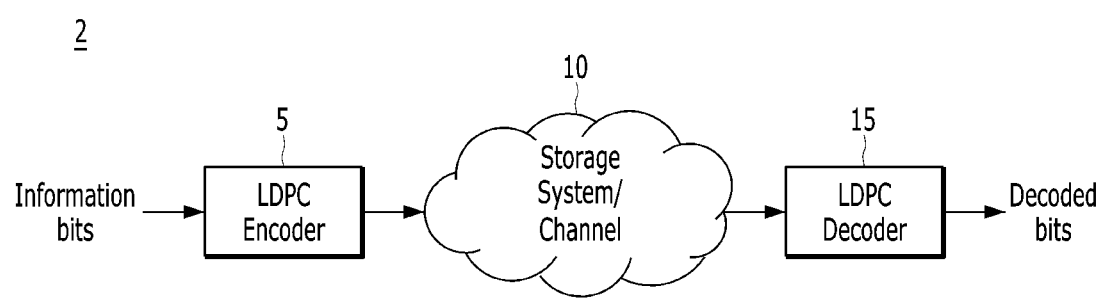
FIG. 1 is a high level block diagram illustrating an error correcting system in accordance with embodiments of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention encompasses numerous alternatives, modifications and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

FIG. 1 is a high-level block diagram illustrating an error correcting system 2, in accordance with embodiments of the present invention. More specifically, the high-level block diagram in FIG. 1 shows error correcting system 2 including an encoder 5 and a decoder 15 using for example LDPC coding and decoding algorithms. That is, error correcting system 2 may include a LDPC encoder 5 and a LDPC decoder 15, although other coding and decoding algorithms can be used.

Figure 2:
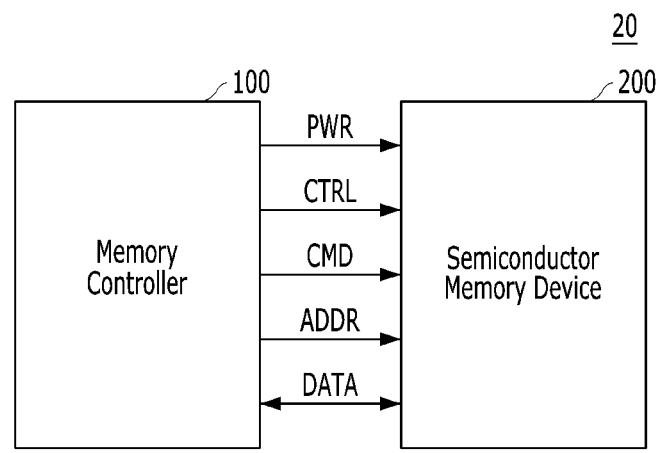
FIG. 2 is a block diagram schematically illustrating a memory system in accordance with embodiments of the present invention.

The LDPC encoder 5 may receive information bits including data which is desired to be stored in a storage system 10 (such as in memory system 20 of FIG. 2). The LDPC encoder 5 may encode the information bits to output LDPC encoded data. The LDPC encoded data from the LDPC encoder 5 may be written to a storage device or memory device of the storage system 10. In various embodiments, the storage device may include a variety of storage types or media. In some embodiments, during being written to or read from the storage device, data is transmitted and received over a wired and/or wireless channel. In this case, the errors in the received codeword may be introduced during transmission of the codeword.

When the stored data in the storage system 10 is requested or otherwise desired (e.g., by an application or user which stored the data), the LDPC decoder 15 may perform LDPC decoding data received from the storage system 10, which may include some noise or errors. In various embodiments, the LDPC decoder 15 may perform LDPC decoding using the decision and/or reliability information for the received data. The decoded bits generated by the LDPC decoder 15 are transmitted to the appropriate entity (e.g., the user or application which requested it). With proper encoding and decoding, the information bits match the decoded bits.

FIG. 2 is a block diagram schematically illustrating a memory system 20 in accordance with an embodiment of the present invention.

Referring FIG. 2, the memory system 20 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 20 is used in an SSD, operation speed of a host (not shown) coupled to the memory system 20 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 20 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 3:
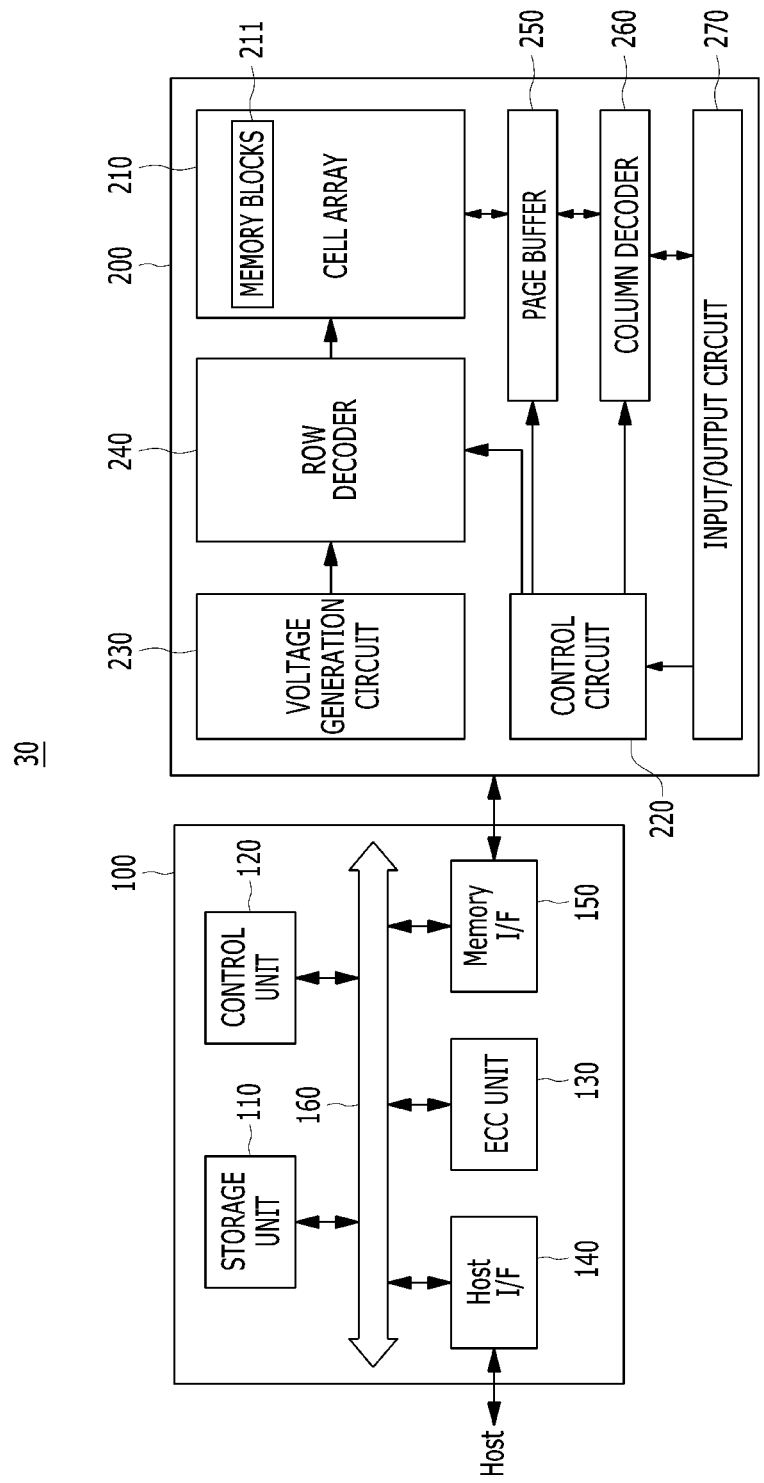
FIG. 3 is a block diagram illustrating a memory system in accordance with embodiments of the present invention.

FIG. 3 is a detailed block diagram illustrating various embodiments of memory system 30 in accordance with one embodiment of the present invention. For example, memory system 30 of FIG. 3 may depict the storage system 10 shown in FIG. 1 or the memory system 20 shown in FIG. 2.

Referring to FIG. 3, the memory system 30 may include the memory controller 100 and the semiconductor memory device 200. The memory system 30 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host. The controller 100 may provide the data read from the memory device 200, to the host, and store the data provided from the host into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

Referring to FIG. 3, the control unit 120 may control general operations of the memory system 30, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as an LDPC code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

As shown in FIG. 3, host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 may be connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 4:
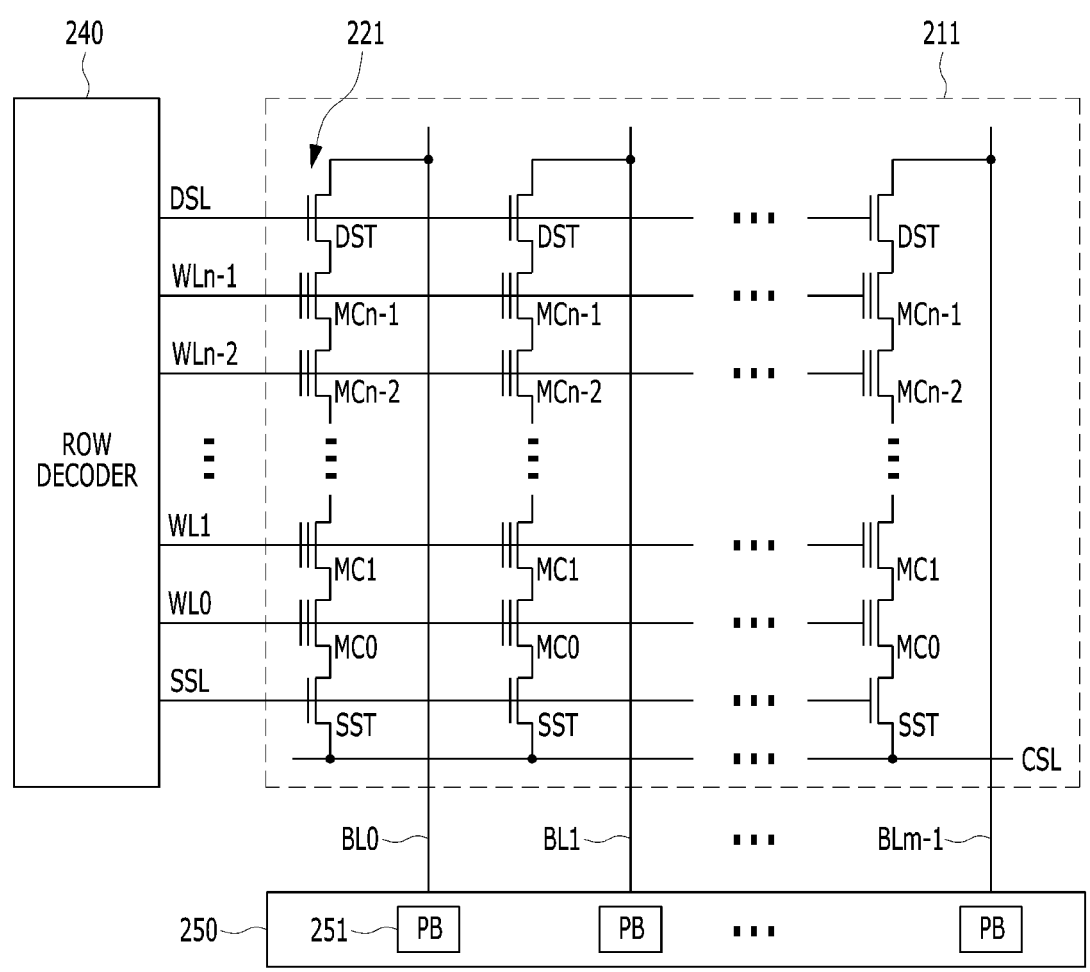
FIG. 4 is a circuit diagram illustrating a memory block of a memory device in accordance with embodiments of the present invention.

FIG. 4 is a circuit diagram illustrating a memory block of a semiconductor memory device in accordance with an embodiment of the present invention. For example, a memory block of FIG. 4 may be the memory blocks 211 of the memory cell array 210 shown in FIG. 3.

Referring to FIG. 4, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 5:
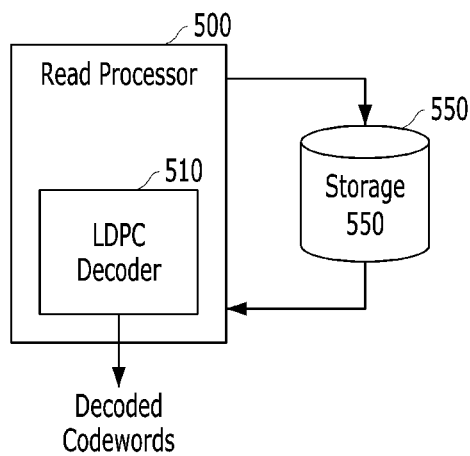
FIG. 5 is a diagram illustrating a storage system in accordance with embodiments of the present invention.

FIG. 5 is a diagram illustrating a storage system in accordance with embodiments of the present invention.

Referring to FIG. 5, the storage system may include a storage 550 and a memory controller such as a read processor 500. The read processor 500 may perform a read operation for data stored in the storage 550. During the read operation, the read processor 500 may read data from the storage 550, which may include some noise or errors, and perform error correction for the read data. In some embodiments, the read processor 500 may include a decoder, for example, the LDPC decoder 510 which may perform LDPC decoding. The read processor 500 may also perform BF decoding and MS decoding. The read processor 500 may include a receiver (not shown) for receiving data from the storage 550.

When the stored data in the storage 550 is requested or otherwise desired (e.g., by an application or user which stored the data), the LDPC decoder 510 may receive data from the storage 550. The received data may include some noise or errors. The LDPC decoder 510 may perform detection on the received data and output decision and/or reliability information. The LDPC decoder 510 may include one of a soft detector and a hard detector. Either the soft detector or the hard detector can provide channel information for decoders, such as the LDPC decoder. For example, the soft detector may output reliability information and a decision for each detected bit. On the other hand, the hard detector may output a hard decision on each bit without providing corresponding reliability information. As an example, the hard detector may output as the hard decision that a particular bit is a "1" or a "0" without indicating how certain or sure the detector is in that decision. In contrast, the soft detector may output a decision and reliability information associated with the decision. In general, reliability information indicates how certain the detector is in a given decision. In one example, a soft detector may output a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

Also, LDPC decoder 510 may perform LDPC decoding using the decision and/or reliability information. LDPC decoder 510 may include one of a soft decoder and a hard decoder. The soft decoder utilizes both the decision and the reliability information to decode the codeword. The hard decoder utilizes only the decision values to decode the codeword. The decoded bits generated by the LDPC decoder 510 are transmitted to the appropriate entity (e.g., the user or application which requested it). With proper encoding and decoding, the information bits match the decoded bits.

In various embodiments, the system shown in FIG. 5 may be implemented using a variety of techniques including an application-specific integrated circuit (ASIC), a field-programmable gate array (FPGA), and/or a general purpose processor (e.g., an Advanced RISC Machine (ARM) core).

LDPC codes may be represented by bipartite graphs. One set of nodes (e.g., the variable or bit nodes) may correspond to elements of the codeword, and the other set of nodes (e.g., check nodes) may correspond to the set of parity check constraints satisfied by the code words.

Figure 6A:
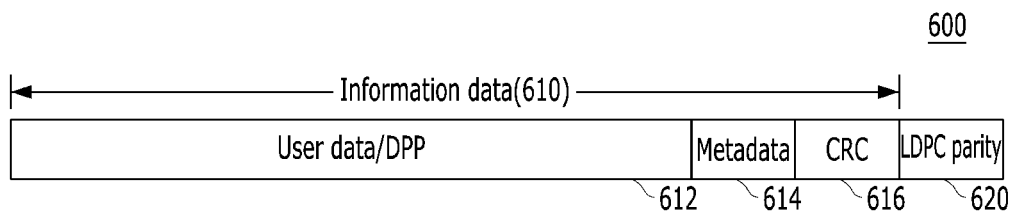
FIG. 6A is a diagram illustrating a format of a codeword to be stored in a storage system in accordance with embodiments of the present invention.

FIG. 6A is a diagram illustrating a format of a codeword 600 to be stored in a storage system. Referring to FIG. 6A, the codeword 600 may include information data 610 and parity 620. In some embodiments, the codeword 600 may be generated by low-density parity-check (LDPC) codes. In other words, the information data 610 may be protected by LDPC codes, and the parity 620 may be LDPC parity. The information data 610 may include user data with data path protection (DPP) 612, meta-data 614 and cyclic redundancy check (CRC) parity bits 616. A CRC code which is an error-detecting code commonly used in digital networks and storage devices may detect accidental changes to raw data.

In a typical LDPC decoder, if the LDPC checksum is zero, the decoder may be terminated. The CRC parity bits 616 will be computed based on the decoded user data 612 and meta-data 614 after the LDPC decoding. If the computed CRC parity bits match the decoded CRC parity bits, decoding may be successful. Otherwise, a mis-correction may be declared.

In some embodiments of the present invention, it is supposed that $x=[x_0, x_1, \ldots, x_{N-1}]$ is a bit vector, and $H=[h_{i,j}]$ is an M×N low-density parity-check matrix with a binary value $h_{i,j}$ at the intersection of row i and column j. Then each row of H provides a parity check for x. If x is a codeword of H, it has $xH^T=0$, where $H^T$ is referred to as the syndrome.

Figure 6B:
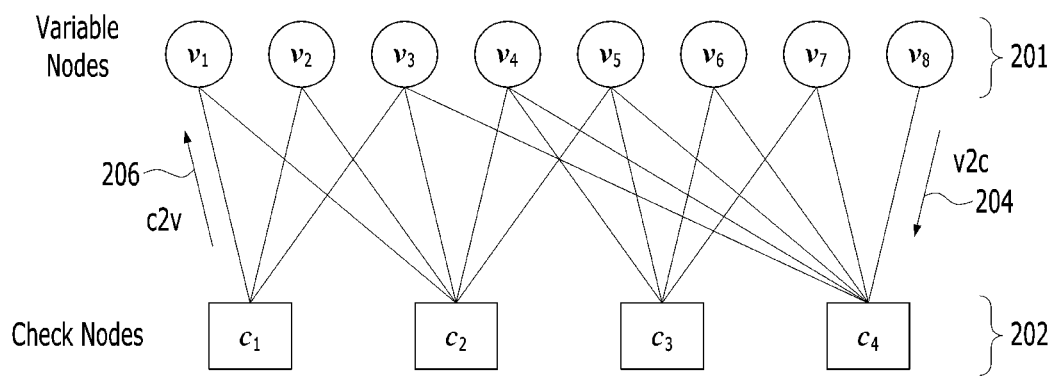

FIG. 6B is a diagram of a bipartite graph showing aspects of node communications in LDPC decoder 510. The decoder 510 includes a number of variable nodes 201, which are part of a variable node unit (VNU). A total of eight variable nodes (VNs) 201 are shown in FIG. 6B, labeled as v1-v8. The VNs 200 communicate with a series of check nodes (CNs) 202 that are part of a check node unit (CNU) described in more detail below. A total of four check nodes are shown in FIG. 6B, labeled as c1-c4. Other respective numbers and arrangements of the respective nodes 201, 202 can be provided. The lines connecting the variable nodes 201 to the check nodes represent two-way communications paths for transmitting messages therebetween. These messages may go from variable to check node as indicated by v2c direction 204 or from check to variable node, as indicated by c2v direction 206. In FIG. 6C, the number of "1s" in the corresponding rows and columns of a low density parity check matrix H is shown that represents the interconnections between variable and check nodes in the graph of FIG. 6B. With regard to FIG. 6C, the term "weight" as used herein refers to the number of entries in a row or a column of the H matrix that have the number "1" listed. As seen in FIG. 6C, the first row associated with c1 has a weight of 3, while the second row associated with c2 has a weight of 5. Viewed differently, the weight of a particular check node may also be defined as the degree of connectivity of the variable nodes to the check node, as shown in FIG. 6B, where the weight of c1 would be 3 and the weight of c2 would be 5.

In LDPC decoding, a syndrome update may check to see if all of the errors have been removed from the codeword. For example, if for parity check matrix H (e.g., matrix of FIG. 6C), the LDPC checksum $\hat{c}H=0$, then the syndrome update can determine that decoding is successful and all errors have been removed from the codeword. If so, the LDPC decoding stops decoding and outputs $\hat{c}=[\hat{c}1, \hat{c}2, \ldots \hat{c}N]$ as the decoded output.

In some embodiments, if the LDPC checksum is not equal to zero, the decoded codeword (i.e., ĉ) is not output and another decoding iteration is performed until a maximum number of iterations, which may be predefined, is reached. In other words, the variable node update calculates new messages V2C messages and new LLR values, the check node update calculates new messages C2V messages, and the codeword update calculates a new codeword and checks if the product of the new codeword and the parity check matrix is 0, that is $\hat{c}H=0$.

Inventive MS Decoder

The inventive MS decoder of the present invention utilizes many elements and performs many of the same operations as conventional MS decoders. Below is a discussion of some of the basics followed by a description of the additional operations and/or components utilized with the inventive MS decoder of the present invention.

A conventional iterative MS decoder alternates between two phases: a variable node to check node "VN-to-CN" phase during which VN's send messages to CN's along their adjacent edges, and a check node to variable node "CN-to-VN" phase during which CN's send messages to their adjacent VN's. In the initialization step of the decoding process, one VN forwards the same message to all of its neighboring CNs, namely a ILLR derived from the corresponding channel output. As noted above, the sign of the LLR indicates the decision (e.g., a positive value corresponds to a "1" decision and a negative value corresponds to a "0" decision) and the magnitude of LLR indicates how sure or certain the detector is in that decision (e.g., a large magnitude indicates a high reliability or certainty). In the CN-to-VN message update phase, a CN uses the incoming messages and a CN update rule to compute and forward, to a VN, a new "CN-to-VN" message, where the VN processes its incoming messages according to the update rule and forwards to each adjacent CN an updated "VN-to-CN" message. After a pre-specified number of iterations, all of the incoming LLR messages to the VNs are summed to produce an estimate of the corresponding code bit.

If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword.

An MS decoder typically provides a stronger correction capability than a BF decoder. A strong correction performance may avoid having to use next read retry on the same page and can improve QoS and performance. The correction performance of an MS decoder can be enhanced by introducing irregularity in the parity-check matrix's column weights. For example, high weight columns typically converge in 1-2 iterations. In certain types of matrices, having irregularity in row weights also helps improve the correction capability significantly. However, a MS decoder is often not able to realize a correction gain incurred by row irregularity.

An MS decoder of the present invention contains a likely channel value (LCH) memory for holding likely channel values, a hard decision (HD) memory for holding the up-to-date best estimates for a decoding outcome, a variable to check node V2C_sign memory for holding the signs of each V2C message, a checksum memory for holding the syndrome values, and a check node unit (CNU) memory for holding for each of the check nodes values of the min1, min2, min1 index (the index of the variable node associated with min 1), and min2 index (the index of the variable node associated with min 2). The CNU memory may be implemented as flip-flops which are accessed/updated per cycle as needed.

During initialization, the LCH memory is initialized with the likely channel values, the CNU memory is initialized to [max, max, 0, 1] for each check node value, and the iteration count is set to 0.

The MS decoder then begins the iterative process noted above which alternates between the "VN-to-CN" phase during which VN's send messages to CN's along their adjacent edges, and the "CN-to-VN" phase during which CN's send messages to their adjacent VN's. As the iterative process begins, for each variable node (VN) in each circulant column of the LDPC matrix, a C2V message is calculated. For example, the C2V message calculation shown in the program code of FIG. 7A can be used to determine, for the C2V messages, a c2v_msg(i) to be sent. As illustrated in FIG. 7A, a c2v_msg(i) reduces a LLR value by "1" when the index of the check node being updated matches the min1 index or else the LLR value is reduced by "2".

Afterwards, the total LLR is calculated by summing the LLRs of all the variable nodes. The HD memory is then updated to hold the best estimate decoding outcome. Following this update, the checksum memory holding the syndrome value is updated.

Then, in the "VN-to-CN" phase, the VN's send messages to CN's along their adjacent edges. In general, a check node Ci receives k messages M from k variable nodes V connected thereto. Each V2C message includes a sign and a value (e.g., Mj={sign, value} from variable node Vj). The value of Mj indicates a reliability of a bit value for a bit "j" corresponding to the variable node Vj. The sign corresponds to the sign of the value. For instance, the sign of the value provides the LLR associated with the bit. Hence, a message M={-, 5} indicates that the LLR of bit "j" is "-5." In other words, the value in the message is the magnitude of the LLR and the sign in the message is the sign of the LLR. The LLRs are indicative of the confidence in zero "0" or one "1" for each codeword bit. For a given codeword bit, a positive LLR value can indicate more confidence in "0" for the bit, a negative LLR value can indicate more confidence in "1" for this bit, and an LLR value of zero can indicate equal likelihood of "0" or "1" for the bit.

When the VN's send messages to CN's, a value of V2C message to be sent to a check node is calculated. A variable node update process is shown for example in the program code of FIG. 7B which updates the LLR data in the V2C messages based on a product of a) a scale factor beta β and b) a difference between the totalized LLR messages received at the variable node being updated and the most recent C2V LLR estimate.

Afterwards, a CNU update process follows such as shown for example in the program code of FIG. 7C. The program code of FIG. 7C addresses three cases: a) Case A, the current index of the CN being updated is the index of min1, b) Case B, the current index of the CN being updated is the index of the min2, and c) Case C, where the index of the CN being updated does not match either of the indices of min1 and min2. These cases are identified in FIG. 7C, which shows specifics CNU updates being made corresponding to the relative magnitudes of the calculated V2C message(s) received at a check node and the magnitudes of former min1 and min2.

The overall strategy is that a check node cannot be more confident in a value than the least confident variable node. As noted above, a check node stores the smallest two values min1 and min2 received in the messages mi from the variable nodes connected thereto, and the indexes of those two variable nodes. When performing the CNU update, the check node being updated compares the value in a message mi received to the smallest values stored. If the value in message mi is larger than both these values, the check node returns the minimum of the two smallest values to the variable node in a response message. If the value in message mi is larger than one of the two smallest values but smaller than the other one, the check node returns the minimum of the two smallest values to the variable node in the response message and replaces, in the storage space, the second smallest value and its index with the LLR value of the new minimum and the index of variable node which supplied the new minimum. If the value in message mi is smaller than the two smallest values, the check node returns the minimum of the two smallest values to the variable node in the response message. Then, the largest of the two smallest values is removed, the previous minimum smallest value becomes the second smallest value, and the value in response message becomes the new minimum smallest value.

If after updating, the checksum is all zero or if the CRC check passes with condition, terminate the decoding process as successful.

In terms of correction capability, each CNU stores min1 value (4-bit), min1 index (6-bit), min2 value (4-bit) and min2 index (6-bit) and also checksum (1-bit). The CNU array is implemented by registers and consumes a large percentage of the generalized constraint (GC) of an MS decoder. The channel information LCH may also be set to have a 4 bit precision.

Other kinds of GC optimized MS decoders may use lower precision (3 bit or 2 bit) in the min1, min2 values and also the LCH memory may be 3 bit or 2 bit. Accordingly, the LCH memory can be set to 3 bit or 2 bit precision as well.

Other types of simplified MS decoder only store min1, min2 and min1 index and checksum in each CNU. This, combined with lower precision, can help reduce GC of MS decoder.

In the inventive decoder (detailed below), an enhanced MS decoder is provided.

Figure 8:
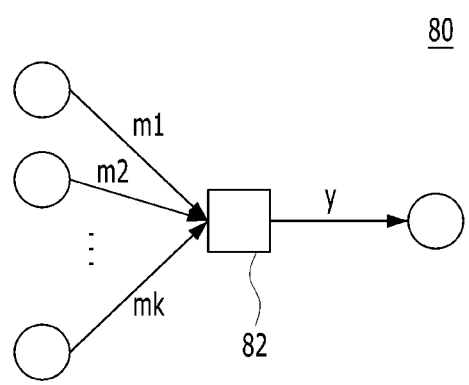
FIG. 8 is a schematic depiction of a MS decoder in accordance with embodiments of the present invention.

The CNU update logic in an MS decoder of the invention is an approximation to a sum-product algorithm (SPA) decoder, of a single-parity-check (SPC) code. FIG. 8 shows a check node 82 of MS decoder 80. The check node 82 can receive m1, m2, ... mi, ... mk V2C messages from different variable nodes K, and can output a calculated result y as a new, updated C2V message. The result y of the MS decoder 80 may be described by Eq. 1:

$$y = \Pi \text{sign}(m_i) * \min(|m_i|) \quad (1)$$

where the result y for the MS decoder is the mathematical product of a) the sign of the V2N message mi received and b) the magnitude of the mi having the lowest value.

Accordingly, the magnitude of the output C2V message y from check node 82 is equal to the minimum value of all V2N inputs.

Meanwhile, the output message of a SPA decoder is described in Eq. 2:

$$y = 2 * \operatorname{atanh}\left(\prod \tanh\left(\frac{m_i}{2}\right)\right) \qquad (2)$$

where y for the SPA decoder is a function of the inverse hyperbolic tangent of the mathematical product of the hyperbolic tangent of the V2N message mi received.

In one embodiment of the invention, MS decoder 80 approximates the output message y by only calculating y with the dominant input V2C message of m1, m2, ..., mi, ... mk, which is the one having the smallest magnitude. This means that MS decoder 80 gives an output with a higher magnitude than a SPA decoder. A scaling factor of for example 0.75 may be applied to the output message y of MS decoder 80 so that resultant scaled output is close to that of a SPA output.

When all check nodes have the same row weight or connectivity, referred to hereinafter as a "check node weight," a scaling factor can be optimized to minimize the approximation error between MS decoder 80 and a SPA decoder. However, when the check nodes have different row weights (check node weights), applying the same scaling factor to the output messages may no longer be optimal.

Separate Scaling Per Check Group

In one embodiment of the invention, the check nodes are classified into several groups according to the check weights (the row weights or the degree of connectivity of the variable nodes to the check nodes). For example, low weight, median weight and high weight groups can be identified. In this example, check nodes that have a connectivity or row weight of 3 may be considered to have a low weight. In this example, check nodes that have a connectivity or row weight of 4 may be considered to have a medium weight. In this example, check nodes that have a connectivity or row weight of 5 may be considered to have a high weight. In this embodiment, the scaling factors of the low weight group are different (and typically lower) than the scaling factors of the median weight group, and the scaling factors of the median weight group are different (and typically lower) than the scaling factors of the high weight group. For example, the scaling factor for the low weight group may range from 0.60 to 0.70, the scaling factor for the medium weight group may range from 0.70 to 0.75, the scaling factor for the high weight group may range from 0.75 to 0.85. The present invention is not limited to these ranges, and furthermore the respective ranges may overlap with each other. These scale factors may be applied to V2C updates noted above.

Accordingly, in one embodiment of the invention, different scaling factors on the C2V messages can be applied to the different weight groups. In one embodiment, by comparing how much additional compensation is needed with different scaling factors for each weight group, the scaling factors to be used for each weight group can be jointly optimized to reduce the overall approximation error between a MS decoder and a SPA decoder.

Additional Compensation

Other than having separate scaling factors per check node group depending on the column weight, in one embodiment of the invention, the approximation error is reduced through the introduction of an additional compensation term.

Figure 9:
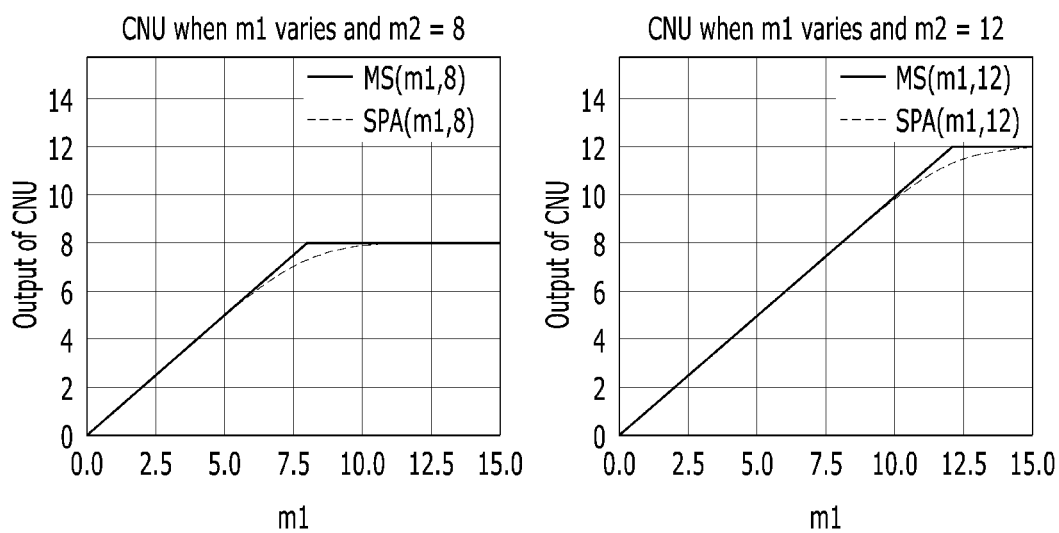
FIG. 9 is a graphical depiction of comparing two error corrections made in accordance with embodiments of the present invention.

For simplicity, FIG. 9 on the left side shows the approximation error of an MS decoder for 2 inputs and 1 output CNU where the difference between the dashed line (SPA calculation Eq. 1) and the solid line (MS calculation Eq. 2) is shown. In this example, the LLR value of the second minimum m2=8, and the LLR value of the first minimum m1 varies. FIG. 9 on the right side shows the approximation error of an MS decoder for 2 inputs and 1 output CNU where the value of the second minimum m2=12 and the value of the first minimum m1 varies. As evident, the approximation error depends on the values of m1 and m2, and when m1=m2, the approximation error reaches its maximum, which is close to 1.

Having recognized this affect, in one embodiment of the invention, when first minimum m1 is equal to second minimum m2, the invention utilizes a compensation term as calculated from Eq. 3:

$$y = \prod \operatorname{sign}(m_i) * \tilde{\min}(|m_i|) \qquad (3)$$

where $\tilde{\min}(|m_i|) = \min 1 - d$ $d = 1$, if $\min 1 = \min 2$, else 0 where y is the mathematical product of a) the sign of the V2N message $m_i$ received and b) the magnitude of the mi having the lowest value.

In the case where min1 is not equal to min2, d is set to zero, and the first minimum m1 is used for the magnitude of mi in Eq. 3. Else, where min1 is equal to min2, the magnitude of min1 offset by the value of 1, the offset value is used for the magnitude of mi in Eq. 3. This compensation may be applied to the V2C updates noted above to reduce the "approximation" error described above.

Figure 10:
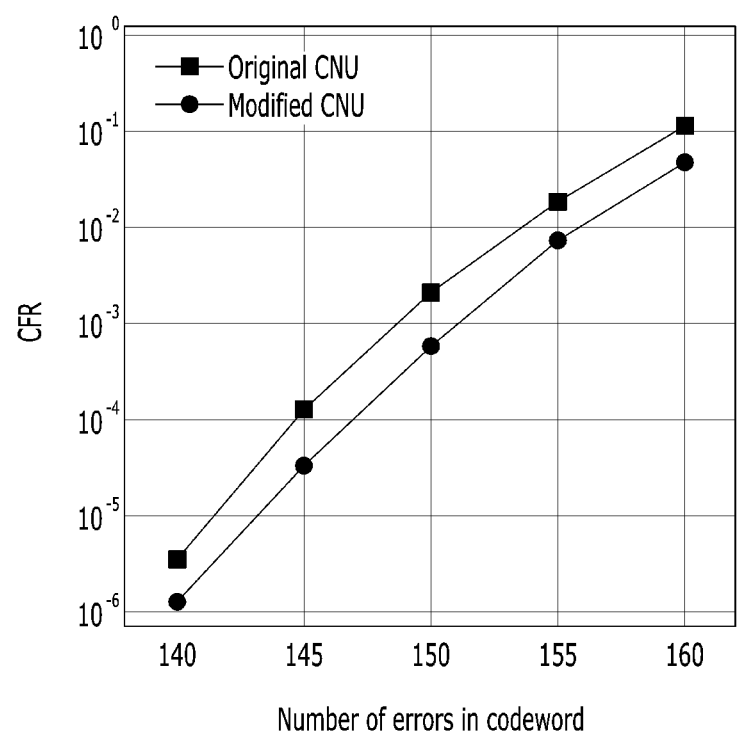
FIG. 10 is a graphical depiction comparison of codeword failure rates with and without error compensation in accordance with embodiments of the present invention.

FIG. 10 is a simulation result showing that the correction is improved with the enhanced CNU scheme described above. FIG. 10 plots the codeword failure rate (CFR) for the original CNU scheme and the modified CNU scheme as a function of the number of errors found in the codeword.

In one embodiment of the invention, the compensation described above can be applied to messages that do not match m1_index or m2_index, by applying compensation to messages that match m1_index or m2_index.

In one embodiment of the invention, for a V2C message that matches m1_index, the same compensation in Eq. (3) is applied to the output message when there are multiple input messages with the same magnitude of min2. Since min3 is typically not tracked in the CNU, in one embodiment of the invention, one additional bit, or a m2m bit, in each CNU is used to indicate if there are multiple input messages with the same or different min2 magnitudes.

The logic to update m2m is described as follows. The m2m bit can be initialized to 0 at the beginning of decoding. When a V2C message matches with min2, the m2m bit (the additional bit) is set to 1. When min2 is replaced by a different value, m2m bit is set to 0. When m2m=1 and the V2C index is equal to the m1_index, this embodiment may set C2V=min2-1, otherwise the embodiment may set C2V=min2.

In one embodiment, the techniques of the inventive MS decoder can improve correction performance for LDPC decoding when there are errors in the data being decoded occurring in a relatively localized time period (i.e., burst errors).

Figure 11:
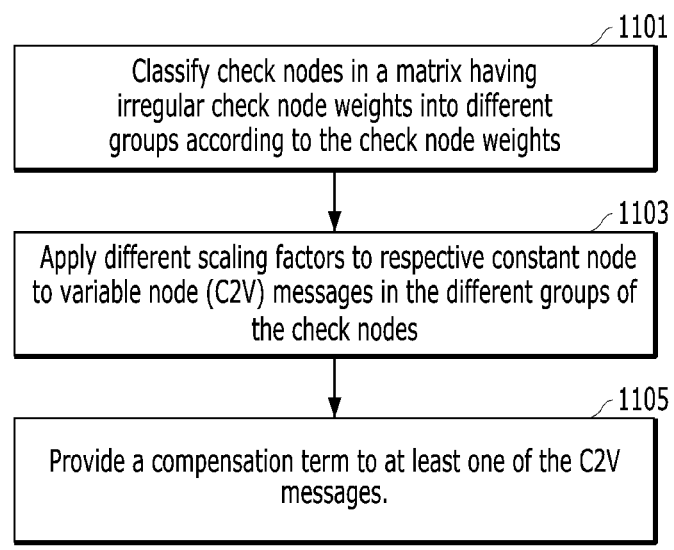
FIG. 11 is a flow chart illustrating a method for decoding data according to another embodiment of the present invention.

In one embodiment of the present invention, there is provided a decoding method as depicted in FIG. 11. This method may be implemented in ECC unit 130 or control circuit 220 of FIG. 2 or may be implemented in LDPC decoder 510 of FIG. 5. In this method at 1101, check nodes in a matrix having irregular check node weights are classified into different groups according to the check node weights. At 1103, different scaling factors are applied to respective constant node to variable node (C2V) messages in the different groups of the check nodes. At 1105, optionally, a compensation term is applied to at least one of the output C2V messages.

In this method, the different scaling factors can approximate a correction performance obtainable by a sum-product algorithm.

In this method, the different groups having different check node weights comprise a low weight group, a median weight group, and a high weight group, and the low weight group has a check node weight lower than that of the medium weight group and the median weight group has a check node weight lower than that of the high weight group. In this method, the scaling factor can approximate a correction performance obtainable by a sum-product algorithm.

In this method, the compensation term may be applied to the output C2V message when there are multiple input variable node to check node (V2N) messages with a same minimum magnitude.

In this method, the compensation term is calculated using the equation (3) noted above. This method may utilize one additional bit, in each C2V message, to indicate when there are multiple input messages with the same minimum magnitude. This method may initialize the additional bit to 0 at a beginning of decoding; when a V2C message matches a minimum value, the method may set the additional bit to 1; and when the minimum value is replaced by a different value, the method may set the additional bit to 0.

In this method, when the additional bit is equal to 1 and a V2C index is equal to a first minimum index, the C2V message may be set equal to a minimum value proceeding a second minimum value, otherwise set the C2V message to the second minimum value.

In this method, values of the scaling factors may be selected that minimize an amount of the compensation term.

Memory System

In another embodiment of the present invention, there is provided a memory system (such as in FIG. 3) having a storage (such as for example storage 550 in FIG. 5) and a decoder (such as for example LDPC decoder 510) coupled to the storage. The decoder is configured to: classify check nodes in a matrix having irregular check node weights into different groups according to the check node weights; apply different scaling factors to respective constant node to variable node (C2V) messages in the different groups of the check nodes; and optionally provide a compensation term to at least one of the C2V messages of the MS decoder.

In this memory system, the different groups having different check node weights comprise a low weight group, a median weight group, and a high weight group. The low weight group has a check node weight lower than that of the medium weight group, and the median weight group has a check node weight lower than that of the high weight group.

In this memory system, the decoder can be configured to add a compensation term which approximates a correction performance obtainable by a sum-product algorithm.

In this memory system, the decoder can be configured to apply the compensation term to the output C2V message when there are multiple input variable node to check node (V2N) messages with a same minimum magnitude. In this memory system, the compensation term can be calculated from equation (3) above.

In this memory system, the decoder can be configured to utilize one additional bit, in each C2V message, to indicate when there are multiple input messages with the same minimum magnitude. The decoder can be configured to: initialize the additional bit to 0 at a beginning of decoding; when a V2C message matches with a minimum value, set the additional bit to 1; and when the minimum value is replaced by a different value, set the additional bit to 0. The decoder can be configured to: when the additional bit is equal to 1 and a V2C index is equal to a first minimum index, set the C2V message equal to a minimum value proceeding a second minimum value, otherwise set the C2V message to the second minimum value.

In this memory system, the decoder can be configured to select values of the scaling factors that minimize an amount of the compensation term.

Although the foregoing embodiments have been described in some detail for purposes of clarity of understanding, the invention is not limited to the details provided. There are many alternative ways of implementing the invention. The disclosed embodiments are illustrative and not restrictive. The present invention is intended to embrace all modifications and alternatives of the disclosed embodiment. Furthermore, the disclosed embodiments may be combined to form additional embodiments.

Indeed, implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be excised from the combination, and the combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A decoding method for decoding data read from a memory, comprising:
    determining check node weights in a matrix used for decoding the data and having irregular check node weights;
    classifying check nodes in the matrix having the irregular check node weights into different groups according to different check node weights; and
    decoding the data read from the memory using scaled min-sum decoding by applying different scaling factors to respective check node to variable node (C2V) messages in the different groups of the check nodes having the different check node weights,
    wherein
    the different scaling factors applied in the scaled min-sum decoding reduce a value of the C2V messages to approximate a correction performance obtainable by a sum-product algorithm if the data read from the memory were decoded by the sum-product algorithm.

2. The method of claim 1, wherein
    the different groups having different check node weights comprise a low weight group, a median weight group, and a high weight group,
    the low weight group has a check node weight lower than that of the medium weight group, and
    the median weight group has a check node weight lower than that of the high weight group.

3. The method of claim 1, further comprising:
    applying a compensation term to at least one of the C2V messages.

4. The method of claim 3, further comprising applying the compensation term to an output C2V message when there are multiple input variable node to check node (V2C) messages with a same minimum magnitude.

5. The method of claim 3, further comprising selecting values of the different scaling factors that minimize an amount of compensation.

6. The method of claim 3, further comprising utilizing one additional bit, in each C2V message, to indicate when there are multiple input messages with a same minimum magnitude.

7. The method of claim 6, further comprising:
    initializing the additional bit to 0 at a beginning of decoding;
    when a variable node to check node (V2C) message matches with a minimum value, setting the additional bit to 1; and
    when the minimum value is replaced by a different value, setting the additional bit to 0.

8. The method of claim 7, wherein, when the additional bit is equal to 1 and a V2C index is equal to a first minimum index, set the C2V message equal to a minimum value proceeding a second minimum value, otherwise set the C2V message to the second minimum value.

9. The method of claim 1, wherein a compensation term is calculated using the following equation:

$$y = \prod \text{sign}(m_i) * \widetilde{\min}(|m_i|)$$

where $\widetilde{\min}(|m_i|) = \min 1 - d$ $d = 1$, if $\min 1 = \min 2$, else 0 where y is a mathematical product of a) a sign of the V2N message $m_i$ received and b) a magnitude of mi having a lowest value if min1 is not equal to min2, else a magnitude of min1 is offset by a value of 1.

10. A memory system, comprising:
a storage; and
a min-sum decoder for decoding data read from the storage, coupled to the storage, and configured to:
 determine check node weights in a matrix used for decoding the data and having irregular check node weights;
 classify check nodes in the matrix having the irregular check node weights into different groups according to different check node weights; and
 decode the data read from the storage using scaled min-sum decoding by applying different scaling factors to respective check node to variable node (C2V) messages in the different groups of the check nodes having the different check node weights,
wherein
the different scaling factors applied in the scaled min-sum decoding reduce a value of the C2V messages to approximate a correction performance obtainable by a sum-product algorithm if the data read from the storage were decoded by the sum-product algorithm.

11. The memory system of claim 10, wherein
the different groups having different check node weights comprise a low weight group, a median weight group, and a high weight group,
the low weight group has a check node weight lower than that of the medium weight group, and
the median weight group has a check node weight lower than that of the high weight group.

12. The memory system of claim 10,
wherein the decoder is configured to add a compensation term to at least one of the C2V messages of the min-sum decoder which further approximates the correction performance obtainable by the sum-product algorithm.

13. The memory system of claim 12, wherein the decoder is configured to apply the compensation term to the output C2V message when there are multiple input variable node to check node (V2C) messages with a same minimum magnitude.

14. The memory system of claim 12, further comprising selecting values of the different scaling factors that minimize an amount of compensation.

15. The memory system of claim 12, wherein the decoder is configured to utilize one additional bit, in each C2V message, to indicate when there are multiple input messages with a same minimum magnitude.

16. The memory system of claim 15, wherein the decoder is configured to:
 initialize the additional bit to 0 at a beginning of decoding;
 when a variable node to check node (V2C) message matches with a minimum value, set the additional bit to 1; and
 when the minimum value is replaced by a different value, set the additional bit to 0.

17. The memory system of claim 16, wherein the decoder is configured to:
 when the additional bit is equal to 1 and a V2C index is equal to a first minimum index, set the C2V message equal to a minimum value proceeding a second minimum value, otherwise set the C2V message to the second minimum value.

18. The memory system of claim 10, wherein a compensation term is calculated using the following equation:

$$y = \prod \text{sign}(m_i) * \tilde{\min}(|m_i|)$$

where $\tilde{\min}(|m_i|) = \min 1 - d$ $d = 1$, if $\min 1 = \min 2$, else $0$ where y is a mathematical product of a) a sign of the V2N message $m_i$ received and b) a magnitude of mi having a lowest value if min1 is not equal to min2, else a magnitude of min1 is offset by a value of 1.

* * * * *